United States Patent [19]

Donovan

[11] Patent Number: 4,682,061
[45] Date of Patent: Jul. 21, 1987

[54] MOSFET TRANSISTOR SWITCH CONTROL

[75] Inventor: William J. Donovan, San Bernandino, Calif.

[73] Assignee: Honeywell Inc., Minneapolis, Minn.

[21] Appl. No.: 858,154

[22] Filed: May 1, 1986

[51] Int. Cl.$^4$ ............... H03K 17/687; H03K 3/42; H03K 3/26; G02B 27/00
[52] U.S. Cl. ............................... 307/571; 307/311; 307/318; 307/572; 307/577; 250/551
[58] Field of Search ............... 307/318, 311, 571, 572, 307/577; 250/551

[56] References Cited

U.S. PATENT DOCUMENTS

| | | | |
|---|---|---|---|
| 3,215,859 | 11/1965 | Sorchych | 307/88.5 |
| 3,532,899 | 10/1970 | Huth et al. | 307/251 |
| 3,942,039 | 3/1976 | Kikuchi et al. | 307/251 |
| 4,139,878 | 2/1979 | Shuey | 307/311 |
| 4,303,831 | 12/1981 | El Hamamsy | 307/311 |
| 4,307,298 | 12/1981 | El Hamamsy et al. | 307/311 |
| 4,323,796 | 4/1982 | Lathrope | 307/353 |
| 4,415,894 | 11/1983 | Dressler et al. | 307/270 |
| 4,423,330 | 12/1983 | El Hamamsy | 307/311 |
| 4,438,356 | 3/1984 | Fleischer | 307/571 |
| 4,564,770 | 1/1986 | Sherman et al. | 307/311 |

Primary Examiner—Stanley D. Miller
Assistant Examiner—M. R. Wambach
Attorney, Agent, or Firm—George A. Leone, Sr.

[57] ABSTRACT

An isolated MOSFET analog switch control circuit is disclosed comprising in combination first and second switching MOSFETs for switching an analog input signal through the control circuit. The MOSFETs have their gates connected together at a gate junction and their sources connected together at a source junction. The control circuit further includes current source apparatus for generating a fixed enhancement voltage referenced to the source voltage of the first and second MOSFETs; and switching apparatus. The switching apparatus has a circuit control isolated from the switching MOSFETs and further has first and second switching terminals, for applying and disconnecting the current source apparatus to the control circuit such that when the current source is applied the switching MOSFETs will be turned on and when the current source is disconnected the switching MOSFETs will be turned off.

11 Claims, 3 Drawing Figures

MOSFET TRANSISTOR SWITCH CONTROL

FIELD OF THE INVENTION

This invention relates to MOSFET transistor switch controls and, in particular, to MOSFET transistor switch controls having the switch control isolated from the switching MOSFETs.

BACKGROUND OF THE INVENTION

A common usage for a Metal Oxide Semiconductor Field Effect Transistor (MOSFET) is as a switch. In such applications, MOSFETs function as a switch between two terminals, the drain and the source, when the proper control voltage is applied to the gate terminal. For applications requiring high current and medium voltage commercially available MOSFETs are of the N-channel, enhancement mode type. The enhancement mode MOSFET requires that the gate be more positive than the source by some voltage, called the enhancement voltage, in order to open the channel between the drain and the source. The enhancement voltage required to turn on commercially available MOSFETs is typically called the threshold voltage and is usually in the range of one to four volts.

Prior art designs of MOSFET switch control circuits, wherein the control is isolated from the switching MOSFETs, cannot effectively switch high frequency ac signals (herein called the "input signal") at high speed, high power, and high switching frequencies. One problem encountered in some designs is a distortion of the input signal due to modulation of the input signal by the enhancement voltage signal applied to the gate. Another problem in devices which employ an oscillator to drive the MOSFET gate occurs because the input signal may pass through the isolation device (transformer, capacitor, etc.) used between the oscillator and the switch. This pass through effect becomes more likely as the ratio of the oscillation frequency approaches the frequency of the switched signal and may result in serious damage to the circuit.

Similar devices are also subject to distortion of the input signal due to switching transients. These transients are present in MOSFETs due to capacitance in the gate to source junction. During the operation of turning a MOSFET switch on or off, the gate to source junction appears as a capacitor. In steady state operation, it is only necessary to maintain this charge against very small leakage currents. For high-speed switching, a large current must be passed to the gate and this may result in distortion to the input signal.

FIG. 1 shows an example of a MOSFET switching circuit using two enhancement mode MOSFETs and an isolated transformer drive. In the circuit shown in FIG. 1, the gate voltage at node 10 is referenced directly to the source voltage at node 20. Such a design causes a current to flow into the source. When the oscillator 50 is enabled, the oscillator-generated current will mix with the input signal current. When the oscillator is disabled, any current present in the circuit will flow, or divide and flow, into the circuits connected to both sides of the transistor switch depending on the voltage levels present. This type of current flow is caused by the internal diodes 30 and 40 (shown in dotted line) that are a part of the internal structure of all enhancement mode MOSFETs. A circuit such as is shown in FIG. 1 has size and cost disadvantages. In addition, at higher switching frequencies, some of the oscillator frequency signal will mix with and modulate the input signal. This type of modulation can also result if the magnitude of the input signal is very small in comparison to the oscillation signal. As the oscillator frequency approaches the frequency of the input signal, major distortion of the input signal can take place.

SUMMARY OF THE INVENTION

An isolated MOSFET switch control circuit is disclosed comprising in combination first and second switching MOSFETs for switching an input signal through the switch control circuit. The MOSFETs have their gates connected together at a gate junction and their sources connected together at a source junction. The control circuit further includes current source means for generating a fixed enhancement voltage referenced to the source voltage of the first and second MOSFETs and switching means. The switching means has a circuit control isolated from the switching MOSFETs and further has first and second switching terminals for applying and disconnecting the current source means to the switch control circuit. When the current source is applied the switching MOSFETs will be turned on and when the current source is disconnected the switching MOSFETs will be turned off.

BRIEF DESCRIPTION OF THE DRAWINGS

For a more complete understanding of the invention, reference is hereby made to the drawings in which.

DESCRIPTION OF THE PREFERRED EMBODIMENT

Figure 1:
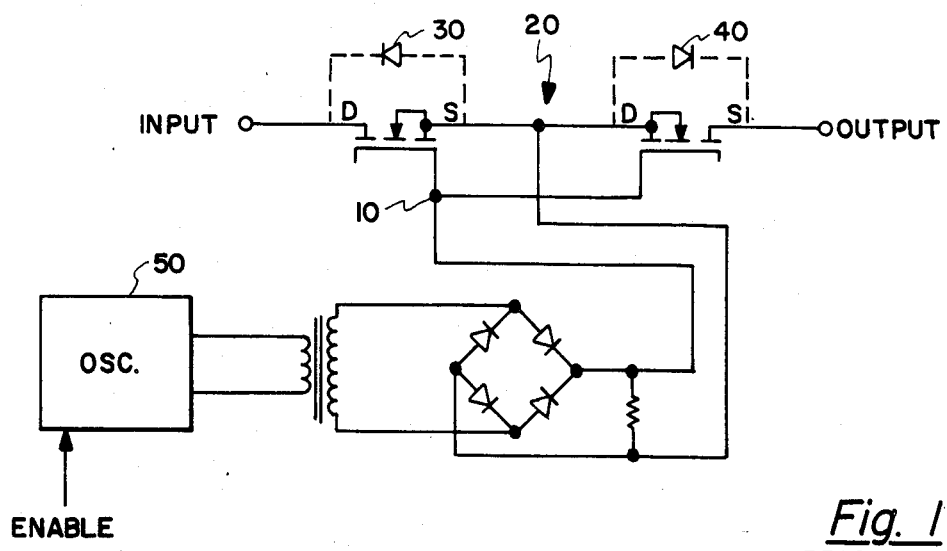
FIG. 1 is a schematic drawing of an isolated transformer drive MOSFET switching circuit.
Figure 2:
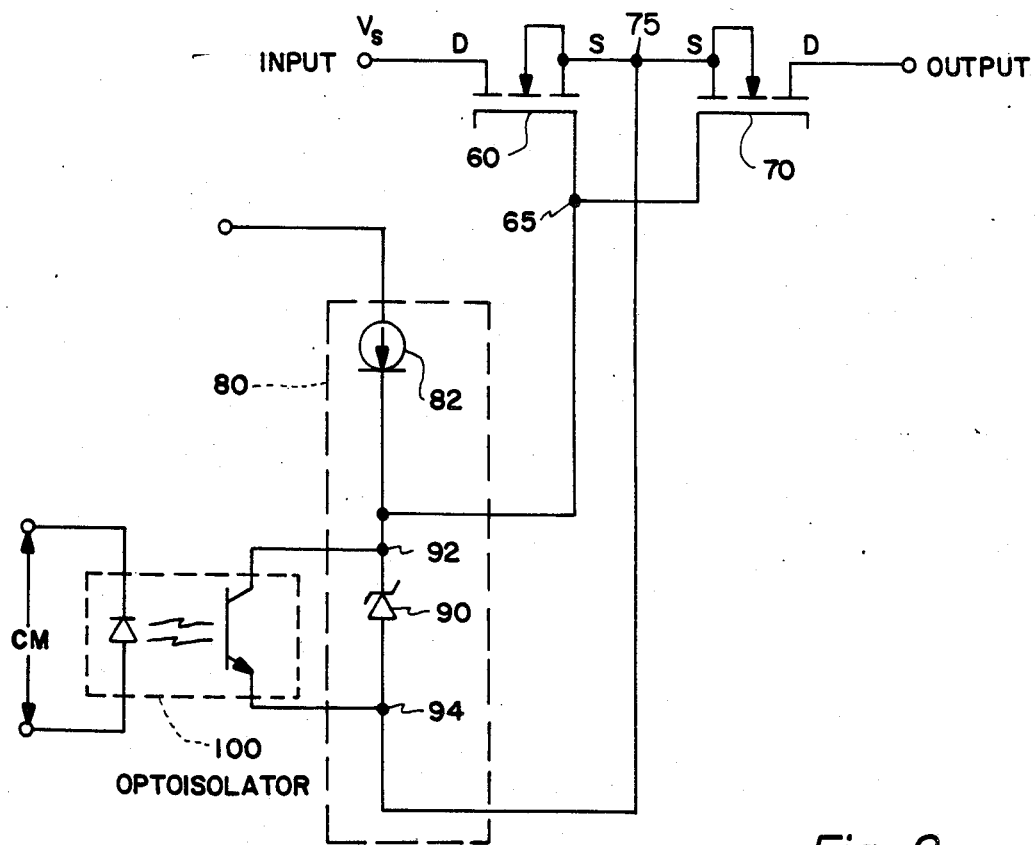
FIG. 2 is a schematic of one example of a MOSFET transistor switch control which provides full isolation between the circuit control and switching MOSFETs.

FIG. 2 is a schematic of one example of a MOSFET transistor switch control which provides full isolation between the circuit control and switching MOSFETs. The embodiment shown in FIG. 2 comprises switching MOSFETs 60 and 70 which switch a signal from the input to the output. MOSFETs 60 and 70 are connected together at gate junction 65 and at source junction 75. The drain of MOSFET 60 serves as the input and the drain of MOSFET 70 serves as the output for the switch control circuit.

The embodiment shown in FIG. 2 further comprises current source means 80 for generating a fixed enhancement voltage referenced through zener diode 90 to the source voltage of MOSFETs 60 and 70, and switching means 100. Switching means 100 has a circuit control means CM for operating the switch control circuit isolated by switching means 100 from the switching MOSFETs, and further has first and second switching terminals 92 and 94 for applying and disconnecting the current source means 80 to the switch control circuit. When circuit control means CM turns switching means 100 off, the switching terminals 92 and 94 are opened and the current source 80 is applied to the MOSFET gates, thereby turning on the switching MOSFETs 60 and 70. Conversely, when the source 80 is disconnected by turning switching means 100 on and thus shorting terminals 92 and 94, the switching MOSFETs 60 and 70 will be turned off.

As shown in dotted line FIG. 2, one embodiment of the current source means 80 may advantageously be comprised of a constant current diode 82 and a zener diode 90. Further, the constant current diode 82 may be advantageously selected to maintain a current of about one milliampere and the zener diode 90 may be advantageously selected to have a breakdown voltage in the range of about 5 volts to about 3.5 volts. The anode of the constant current diode 82 is connected to an external voltage source, $V_{BIAS}$. $V_{BIAS}$ must be equal to, or greater than, the sum of the maximum positive input signal, the breakdown voltage of zener diode 90 and the voltage drop across diode 82. The cathode of the diode 82 is coupled to the cathode of the zener diode 90, terminal 92 of the switching means 100 and the gate junction 65. The anode of zener diode 90 is connected to the second switching terminal 94 of the switching means 100 and the source junction 75. In one embodiment of the invention, the switching means 100 may be an optoisolator switch or similar device. Control Means is any control input for turning on the switching means. In the case of an optoisolator switch, for example, the control means would be any device causing a current to pass through the diode and the optoisolator 100, causing the diode to become illuminated. The illumination would then cause the photo-transistor in optoisolator 100 to be rendered conductive, thereby turning the optoisolator switch on and the switching MOSFETs 60 and 70 off.

The operation of the embodiment of the device as shown in FIG. 2 is as follows. An input signal, $V_S$ is applied to the input. With the circuit control means CM turning the switching means 100 on, switching terminals 92 and 94 are shorted together through switching means 100 and the gate voltage at gate junction 65 approximately equals the source voltage at source junction 75. In this mode both switching MOSFETs will be turned off. When the control means CM is applied to turn the switching means 100 off, voltage from the gate junction 65 to the source junction 75 equals the voltage drop across zener diode 90 and the MOSFETs are turned on, thereby switching through the signal $V_S$ from the input to the output of the switch control circuit.

Figure 3:
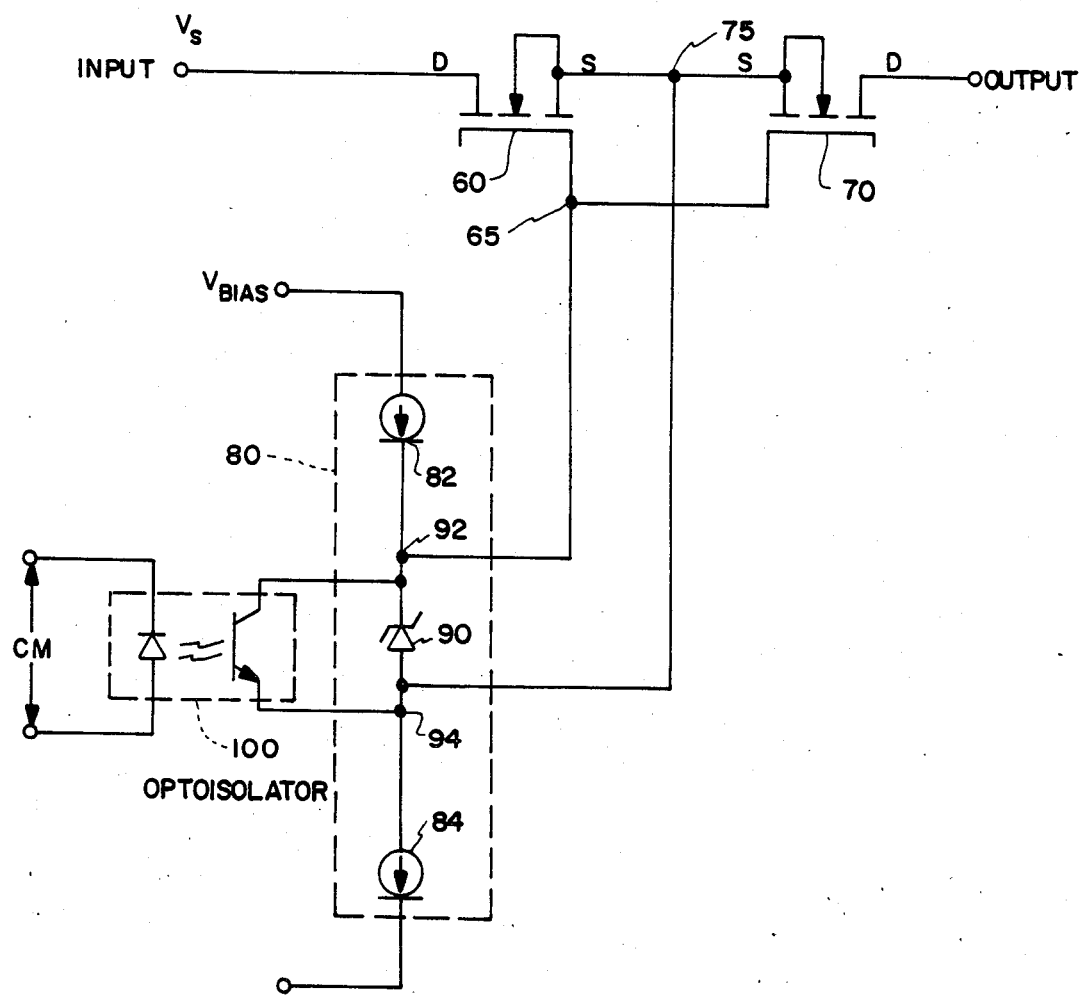
FIG. 3 is a schematic of one example of a MOSFET transistor switch which provides full isolation between the circuit control and switching MOSFETs without injecting a current into the source.

FIG. 3 shows yet another embodiment of the present invention wherein the current source means 80 further comprises a second constant current diode 84. The second diode 84 is matched to the first constant current diode 82. The anode of diode 84 is connected to the anode of zener diode 90 and the second switching terminal 94 of switching means 100. The cathode of diode 84 is connected to an external voltage source means for providing a negative bias $V_{-BIAS}$.

The circuit of FIG. 3 operates as follows. The constant current diodes 82 and 84 are advantageously matched to assure that during steady state operation the current provided to the switch control circuit by the constant current diode 82 is removed by the diode 84. This provides a path that, while referenced to the source junction 75, does not inject a current (within the limits imposed by the matching of the two diodes) into the source junction 75. The zener voltage at junction 65 must be equal to the desired amount of enhancement voltage for the MOSFET switches. The positive bias, $V_{BIAS}$, must be equal to, or greater than, the sum of the maximum positive input signal, the zener breakdown voltage of zener diode 90 and the voltage drop across the constant current diode 82. The negative bias, $V_{-BIAS}$, must be equal to or greater than the sum of the maximum negative input signal plus the voltage drop across the constant current diode 84.

While there has been shown and described a preferred embodiment of the invention, those skilled in the art will appreciate that various changes and modifications may be made to the illustrated embodiments without departing from the true spirit and scope of the invention which is to be determined from the appended claims. For example, while the embodiments included herein employ an N-channel type enhancement MOSFET, it can be appreciated that, with appropriate changes of polarity in the circuit connections, P-channel type MOSFETs may be appropriately used in certain embodiments of the invention.

The embodiments of the invention in which an exclusive property or right is claimed are defined as follows:

1. An isolated MOSFET switch control circuit having an input port and an output port comprising:
    first and second switching MOSFETs for switching an input signal through the switch control circuit, the MOSFETs having their gates connected together at a gate junction, their sources connected together at a source junction, the drain of the first MOSFET connected to the input port and the drain of the second MOSFET connected to the output port;
    current source means for generating a fixed enhancement voltage the current source means comprising a constant current diode having its anode connected to an external voltage source, and a zener diode being connected at the cathode to the cathode of the constant current diode, a first switching means and the gate junction of the MOSFETs and being connected at the anode to a second switching terminal of the switching means and the source junction of the MOSFETs;
    circuit control means for operating the switch control circuit; and
    wherein said switching means for isolating the circuit control means from the switching MOSFETs and for applying and disconnecting the current source means to the switch control circuit such that, when the circuit control means turns the switching means off, the current source is applied and the switching MOSFETs will be turned on, a first switching terminal of and when the circuit control means turns the switching means off, the current source is disconnected and the switching MOSFETs will be turned off.

2. The device of claim 1 wherein the constant current diode maintains a current of about 1 milliampere and the zener diode has a breakdown voltage in the range of about 5 volts to about 3.5 volts.

3. The device of claim 2 wherein the switching means comprises an optoisolator switch.

4. The device of claim 1 wherein the switching means comprises an optoisolator switch.

5. An isolated MOSFET switch control circuit having an input port and an output port comprising:
    first and second switching MOSFETs for switching an input signal through the control circuit, the MOSFETs having their gates connected together at a gate junction, their sources connected together at a source junction the drain of the first MOSFET connected to the input port and the drain of the second MOSFET connected to the output port;

current source means for generating a fixed enhancement voltage without injecting steady state current into the source of the MOSFETs;

circuit control means for operating an isolating switching means; and said isolating switching means for isolating the circuit control means from the switching MOSFETs and for applying and disconnecting the current source means to the switch control circuit such that, when the circuit control means turns the switching means off, the current source is disconnected and the switching MOSFETs will be turned off, and where the current source means comprises:

a first constant current diode having its anode connected to an external voltage source means for providing a positive bias;

a second constant current diode matched to the first constant current diode and having its cathode connected to an external voltage means for providing a negative bias; and a Zener diode connected at the cathode to the cathode of the first constant current diode, a first switching terminal of the isolating switching means and the gate junction of the MOSFETs and being connected at the anode to a second switching terminal of the isolating switching means, to the anode of the second constant current diode, and to the source junction of the MOSFETs.

6. The device of claim 5 wherein the switching means comprises an optoisolator switch.

7. The device of claim 5 wherein the constant current diodes maintain a current of about 1 milliampere and the zener diode has a breakdown voltage in the range of about 5 volts to about 3.5 volts.

8. The device of claim 4 wherein the switching means comprises an optoisolator switch.

9. An isolated MOSFET analog switch control circuit having an input port and an output port comprising:

first and second switching N-channel enhancement mode MOSFETs for switching an anlog input signal through the control circuit, the MOSFETs having theirs gates connected together at a gate junction, their sources connected together at a source junction;

current source means for generating a fixed enhancement voltage without injecting steady state current into the source, the drain of the first MOSFET connected to the input port and the drain of the second MOSFET connected to the output port;

circuit control means for operating the switch control; and switching means for isolating the circuit control means from the switching MOSFETs and for applying and disconnecting the current source means to the switch control circuit such that, when the circuit control means turns the switching means off, the current source is applied and the switching MOSFETs will be turned on, and when the circuit control means turns the switching means off, the current source is disconnected and the switching MOSFETs will be turned off, and where the current source means comprises:

a first constant current diode having its anode connected to an external voltage source means for providing a positive bias;

a second constant current diode matched to the first constant current diode and having its cathode connected to an external voltage source means for providing a negative bias; and a Zener diode connected at the cathode to the cathode of the first constant current diode, a first switching terminal of the isolating switching means and the gate junction of the MOSFETs and being connected at the anode to a second switching terminal of the isolating switching means, to the anode of the second constant current diode, and to the source junction of the MOSFETs.

10. The device of claim 9 wherein the switching means comprises an optoisolator switch.

11. The device of claim 10 wherein the constant current diodes maintain a current of about 1 milliampere and the zener diode has a breakdown voltage in the range of about 5 volts to about 3.5 volts.

* * * * *

UNITED STATES PATENT AND TRADEMARK OFFICE
CERTIFICATE OF CORRECTION

PATENT NO. : 4,682,061

DATED : July 21, 1987

INVENTOR(S) : William J. Donovan

It is certified that error appears in the above-identified patent and that said Letters Patent is hereby corrected as shown below:

Column 4, line 35, after the comma, please add--a first switching terminal of--.

Column 4, lines 48 and 49, delete after the comma, "a first switching terminal of".

Column 5, line 21, after "voltage" insert--source--.

Signed and Sealed this

Tenth Day of November, 1987

Attest:

DONALD J. QUIGG

Attesting Officer

Commissioner of Patents and Trademarks